(12) United States Patent
Kiselev et al.

(10) Patent No.: US 8,304,555 B2
(45) Date of Patent: Nov. 6, 2012

(54) THIAZOLOTHIAZOLE DERIVATIVES AND ORGANIC ELECTRONIC DEVICE USING THE SAME

(75) Inventors: Roman Kiselev, Daejeon (KR); Seok-Hee Yoon, Daejeon (KR); Hyeon Choi, Daejeon (KR); Jae-Min Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 112 days.

(21) Appl. No.: 12/308,373

(22) PCT Filed: Jun. 15, 2007

(86) PCT No.: PCT/KR2007/002906
§ 371 (c)(1),
(2), (4) Date: Dec. 12, 2008

(87) PCT Pub. No.: WO2007/145482
PCT Pub. Date: Dec. 21, 2007

(65) Prior Publication Data
US 2010/0236631 A1  Sep. 23, 2010

(30) Foreign Application Priority Data
Jun. 15, 2006  (KR) .................. 10-2006-0053801

(51) Int. Cl.
*C07D 277/04*  (2006.01)
*C07D 277/08*  (2006.01)
(52) U.S. Cl. ..................................... 548/146
(58) Field of Classification Search ............... None
See application file for complete search history.

(56) References Cited

U.S. PATENT DOCUMENTS 3,326,627 A * 6/1967 Hans Dressler et al. .......... 8/513
3,630,738 A * 12/1971 Dear et al. .................... 430/564
2007/0128764 A1 * 6/2007 Tomino et al. .................. 438/99
2010/0084637 A1 * 4/2010 Choi et al. ........................ 257/40
2010/0240910 A1 * 9/2010 Hwang et al. .................. 549/59

FOREIGN PATENT DOCUMENTS

JP  58-009149  1/1983
JP  60-214791  10/1985

OTHER PUBLICATIONS

Ando, et al Synthetic Metals, 156 (2006) 327-331.*
Sun et al Computational Materials Science 39 (2007) 376-380.*
Osaka et al., Polymer Preprints (American Chemical Society, Division of Polymer Chemistry) 48, p. 100 (2007).*
Shinji Ando et al.: "Synthesis, physical properties, and field-effect transistors of novel thiophene/thiazolithiazole co-oligomers" Journal of Materials Chemistry, The Royal Society of Chemistry, Cambridge, GB LNKD—DOI: 10.1039/B403699A, vol. 14, No. 12, Jun. 21, 2004, pp. 1787-1790, XP003018910 ISSN: 0959-9428.
Qiang Peng et al.: "Synthesis and Electroluminescent Properties of Copolymers Based on Fluorene and 2,5-Di(2-hexyloxyphenyl)thiazolithiazole" Macromolecules, vol. 38, Jul. 26, 2005, pp. 7292-7298, XP008102921.

* cited by examiner

*Primary Examiner* — Kamal Saeed
*Assistant Examiner* — Nyeemah A Grazier
(74) *Attorney, Agent, or Firm* — McKenna Long & Aldridge LLP

(57) ABSTRACT

The present invention relates to novel thiazolothiazole derivatives and an organic electronic device such as an organic light emitting device, an organic transistor, and an organic solar cell using the same. In the compound of the invention, various substituents are introduced to the core structure, so as to satisfy the requirements such as suitable energy levels, and electrochemical and thermal stability, and also have amorphous or crystalline property depending on the kind of the substituents, so as to satisfy the characteristics individually required for each of the devices. Further, an organic semiconductor of p-type or n-type can be fabricated by introducing various substituents to the core structure having a property of n-type. Therefore, the compound of the present invention can provide a device having higher stability.

17 Claims, 4 Drawing Sheets

[Fig. 1]
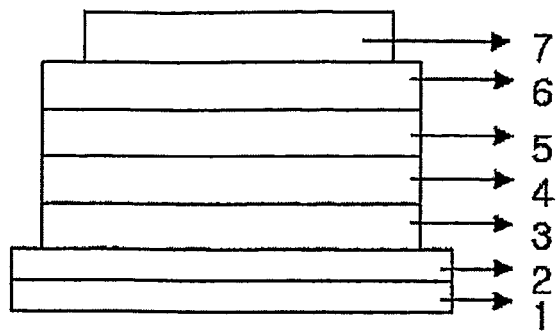
[Fig. 2]
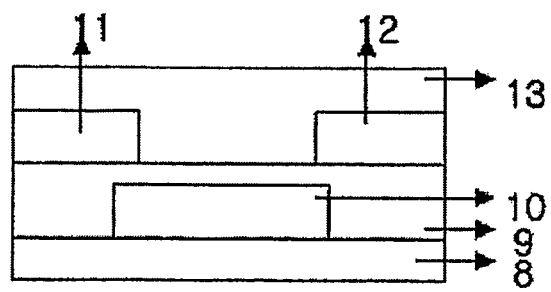
[Fig. 3]
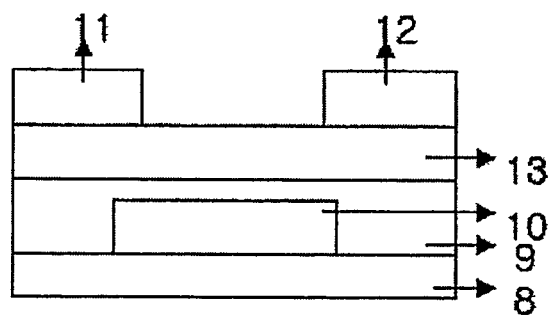
[Fig. 4]
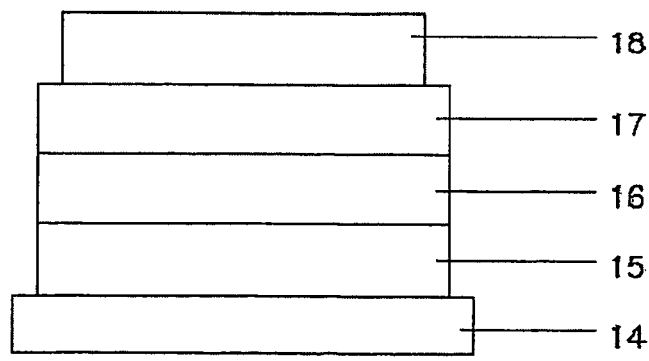

[Fig. 5]
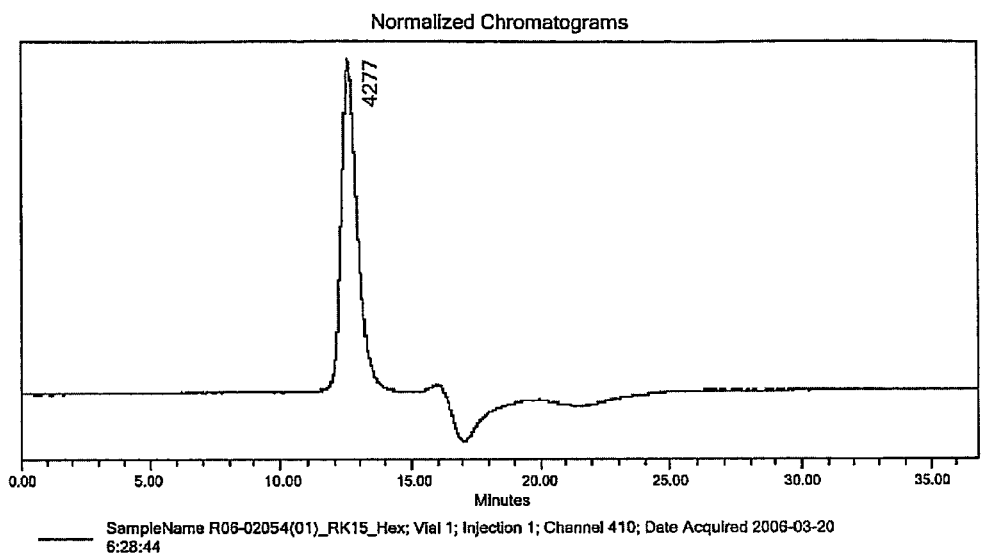
[Fig. 6]
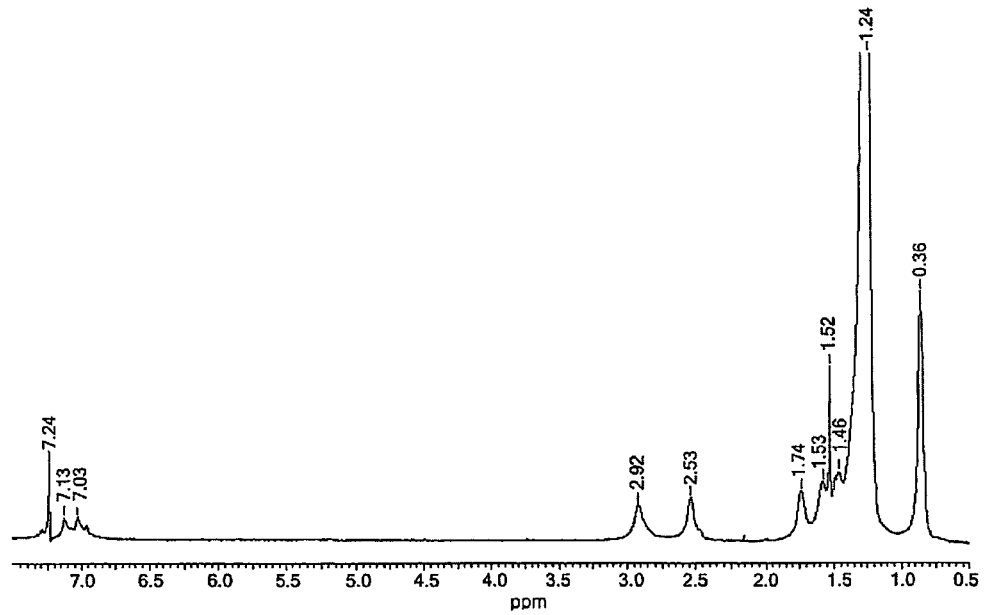

[Fig. 7]
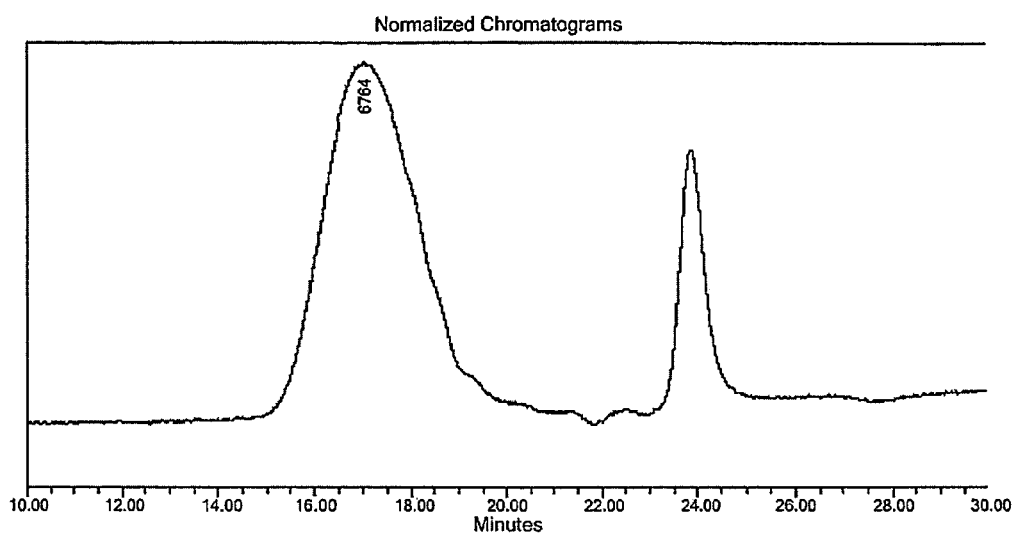
[Fig. 8]
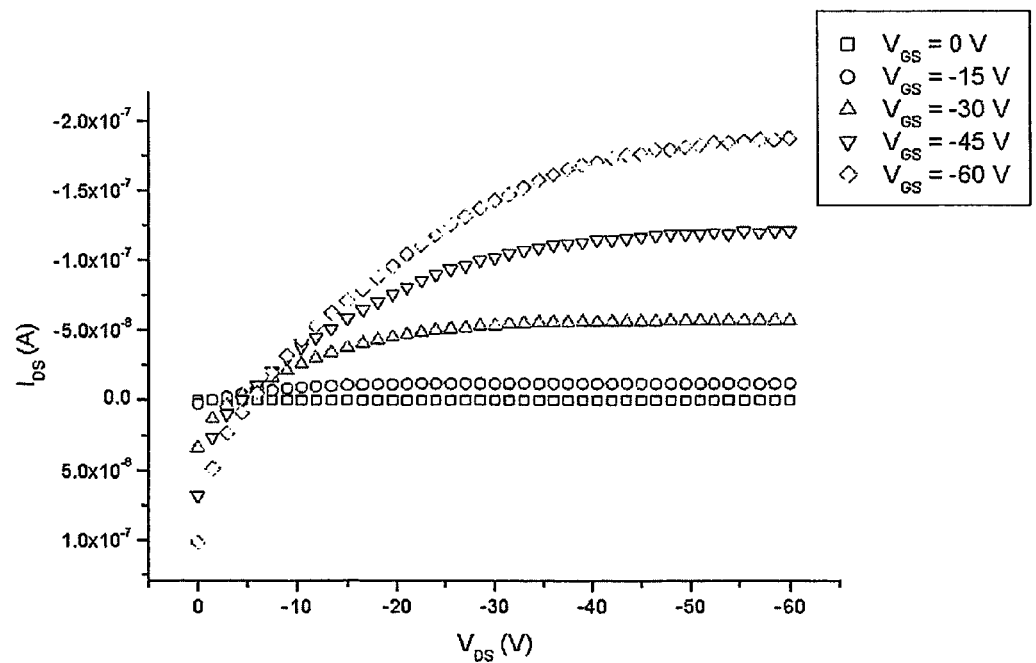

[Fig. 9]
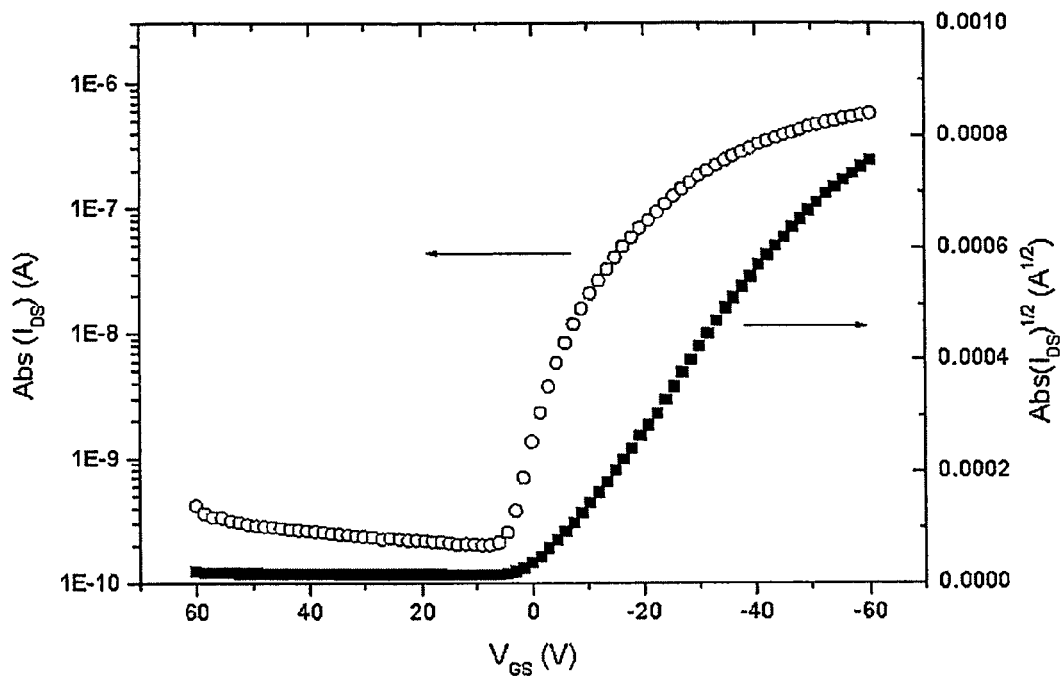

THIAZOLOTHIAZOLE DERIVATIVES AND ORGANIC ELECTRONIC DEVICE USING THE SAME

This application claims the benefit of PCT/KR2007/002906 filed on Jun. 15, 2007 and also Korean Patent Application No. 10-2006-0053801 filed on Jun. 15, 2006, which is hereby incorporated by reference for all purposes as if fully set forth herein.

TECHNICAL FIELD

The present invention relates to novel thiazolothiazole derivatives and an organic electronic device using the same. This application claims priority from Korean Patent Application No. 10-2006-0053801 filed on Jun. 15, 2006 in the Korean Intellectual Property Office, the disclosure of which is incorporated herein by reference in its entirety.

BACKGROUND ART

The current society, also referred to as an information society, has proceeded, accompanied by the discovery of an inorganic semiconductor, which typically includes Si, and by the development of a wide range of the electronic devices using the same. However, the preparation of an electronic device using an inorganic material requires a high-temperature or vacuum process, thereby requiring lots of investments on the equipments, and further has undesirable physical properties for the flexible displays which have recently attracted a great deal of attention as a next-generation display.

In order to solve the above-described problems, there are suggested organic semiconductor materials, which have recently attracted a great deal of attention as a semiconductor material having various physical properties. The organic semiconductor materials can be employed in a variety of the electronic devices, which had previously used inorganic semiconductor materials. Typical examples of the electronic devices using the organic semiconductor materials include an organic light emitting device, an organic solar cell, and an organic thin film transistor.

The organic electronic device, such as an organic solar cell, an organic light emitting device, or an organic transistor, is an electronic device employing the semiconductor properties of the organic semiconductor material, and usually comprises at least two electrodes and an organic material layer between the two electrodes. For example, a solar cell generates electricity using the electrons and the holes, separated from excitons which are generated in an organic material layer by means of solar energy. The organic light emitting device introduces the electrons and the holes from two electrodes to the organic material layer, thereby converting current to visible light. The organic transistor transports the holes or the electrons which are formed on an organic material layer by means of the voltage applied on a gate between a source electrode and a drain electrode. In order to improve the electronic devices, the electronic devices can further comprise an electron/hole injecting layer, an electron/hole extracting layer, or an electron/hole transporting layer.

The organic semiconductor materials which are used for the electronic devices should have good hole or electron mobility. To meet this requirement, most of the organic semiconductor materials are configured to have conjugated structures.

Further, the organic semiconductor materials used in each of the electronic devices have various preferable morphologies, depending on the characteristics required from the devices.

For example, when a thin film is formed using an organic semiconductor material, the thin film in the organic light emitting device preferably has amorphous property, whereas the thin film in the organic thin film transistor preferably has crystallinity.

That is, if an organic thin film in the organic light emitting device preferably has a crystalline property, light emitting efficiency may be reduced, the quenching sites in the charge transport are increased, or the leakage current is increased, thus leading to deterioration of the device performance.

On the other hand, it is favorable that the organic transistor has larger charge transfer property of the organic material layer, and accordingly, it is preferable that packing between the molecules of the organic materials are effective, thereby providing the organic thin film with crystallinity. Most preferably, this crystalline organic film particularly has a single crystal form, and in the case where this crystalline organic film has a polycrystalline form, preferably, the size of each domain is large, and the domains are well connected with each other.

In order to satisfy these requirements, the substances having non-planar structures such as NPB (4,4'-bis[N-(1-naphthyl)-N-phenylamino]biphenyl), and $Alq_3$ (aluminum tris(8-hydroxyquinoline)) are usually used so as to form amorphous thin films in the organic light emitting devices, and the substances having rod-like structures such as pentacene and polythiophene, or the substances having planar structures such as phthalocyanine derivative are usually used so as to easily effect packing between the molecules in the organic transistors.

On the other hand, the organic electronic device comprising at least two organic material layers can be prepared, in which at least two kinds of the organic semiconductor material having different functionalities are laminated, in order to improve the device performance.

For example, the organic light emitting device can further comprise a hole injecting layer, a hole transporting layer, an electron transporting layer, and an electron injecting layer to facilitate injection and transportation of the holes or electrons from the anode or the cathode, thus enhancing the device performance.

In the case of the organic thin film transistor, there is a method, which involves introducing an auxiliary electrode comprising an organic semiconductor, or subjecting the electrode to an SAM (Self Assembled Monolayer) treatment with an organic material to reduce the contact resistance between the semiconductor layer and the electrode. Further, there is used a method, which involves treating the surface of the insulating layer with an organic material to improve the characteristics concerning the contact with a semiconductor.

In addition, the organic semiconductor material used in the organic electronic device preferably has thermal stability against Joule heat which is generated during the transfer of the charges in the device, and also preferably has a suitable band gap, and an HOMO or LUMO energy level for easy injection or transport of the charges. Further, the organic semiconductor material should be excellent in chemical stability, and the electrode should be excellent in the interface characteristics with an adjacent layer, as well as in stability against moisture or oxygen.

DISCLOSURE

[Technical Problem]

There is a need of an organic material, which satisfies the characteristics commonly required for the organic electronic device as described above, or the characteristics individually required according to the kind of the electronic device, and if desired, which is more suitable for specific applications in the relevant field. Therefore, it is an object of the present invention to provide novel thiazolothiazole derivatives and an organic electronic device using the same.

[Technical Solution]

The present inventors have discovered a novel compound comprising a thiazolothiazole group. Further, they have found that the thiazolothiazole group in the novel compound is bonded with various substituents having a property of p-type or n-type, and the structure having the property of p-type or n-type can be introduced to a molecule, so as to give higher stability, and the compound is polymerized or oligomerized to satisfy the requirements such as suitable energy levels, and electrochemical and thermal stability. Thus, it can be used for an organic electronic device such as an organic light emitting device, an organic transistor, and an organic solar cell.

ADVANTAGEOUS EFFECTS

The compound of the present invention is a novel compound, which can satisfy the requirements for use in an organic electronic device such as an organic light emitting device, an organic transistor, and an organic solar cell, such as suitable energy levels, and the above-described electrochemical and thermal stability, by introducing various substituents to the core structure, and which also have amorphous or crystalline property depending on the kind of the substituents, to satisfy the characteristics individually required for each of the devices. Further, an organic semiconductor of p-type or n-type can be fabricated by introducing various substituents to the core structure having a property of n-type. Therefore, the compound of the present invention can play various roles in the organic electronic device, and provide a device having higher charge mobility and stability when it is employed in the organic electronic device.

DESCRIPTION OF DRAWINGS

FIG. 1 is a view illustrating an example of an organic light emitting device comprising a substrate (1), an anode (2), a hole injecting layer (3), a hole transporting layer (4), a light emitting layer (5), an electron injecting layer (6), and a cathode (7).

FIG. 2 is a view illustrating an example of a bottom contact type organic thin film transistor device comprising a substrate (8), an insulating layer (9), a gate electrode (10), a source electrode (11), a drain electrode (12), and an organic material layer (13).

FIG. 3 is a view illustrating an example of a top contact type organic thin film transistor device comprising a substrate (8), an insulating layer (9), a gate electrode (10), a source electrode (11), a drain electrode (12), and an organic material layer (13).

FIG. 4 is a view illustrating an example of an organic solar cell comprising a substrate (14), an anode (15), an electron donor layer (16), an electron acceptor layer (17), and a cathode (18).

FIGS. 5, 6 and 7 are a NMR graph and a GPC graph of the compounds prepared in Examples 1 and 2, respectively.

FIGS. 8 and 9 are a characteristic graph of the transistor prepared in Example 4, respectively.

BEST MODE

The present invention provides a compound comprising a structural unit of the following formula 1:

[Formula 1]

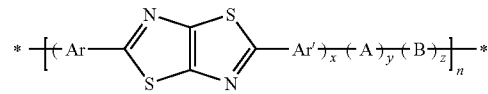

wherein x is a real number with $0 < x \leq 1$, y is a real number with $0 \leq y < 1$, z is a real number with $0 \leq z < 1$, and $x+y+z=1$;

n is an integer of 1 to 1000, more preferably an integer of 10 to 1000;

Ar and Ar' are the same as or different from each other, and are each independently a bivalent cyclic or non-cyclic hydrocarbon group having a conjugated structure, or a bivalent heterocyclic group having a conjugated structure; and A and B are the same as or different from each other, and are each independently a bivalent cyclic or non-cyclic hydrocarbon group having a conjugated structure, a bivalent heterocyclic group having a conjugated structure, or an acyclic group as follows:

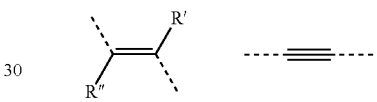

(wherein R' and R" are the same as or different from each other, and may be each independently a hydrogen atom; a halogen atom; a linear, branched, or cyclic alkyl group; a linear, branched, or cyclic alkoxy group; a thioalkoxy group; a nitrile group; a nitro group; an amino group; a substituted or unsubstituted aryl group, or a substituted or unsubstituted heteroaryl group; and the dotted line is a portion linked to a backbone of the formula 1).

In the formula 1, Ar and Ar' may be an arylene group or heteroarylene group having a conjugated structure.

In the formula 1, A or B is preferably an aromatic group (Ar").

As an example of A or B, the aromatic group (Ar") is an arylene group or a heteroarylene group, preferably a group represented by the following formulae.

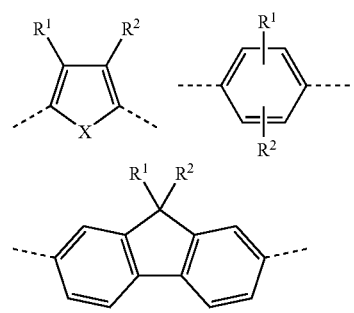

wherein X is O, S, Se, $NR^3$, $SiR^3R^4$, or $CR^3R^4$, and $R^3$ and $R^4$ are the same as or different from each other, and are each independently a hydrogen atom, a linear, branched, or cyclic alkyl group or aryl group, and may be bonded to each other to form a ring;

$R^1$ and $R^2$ are the same as or different from each other, and are each independently a hydrogen atom, a hydroxyl group, a halogen atom, a nitrile group, a nitro group, an ester group, an ether group, an amino group, an imide group, a silane group, a thioester group, a substituted or unsubstituted, linear, branched, or cyclic alkyl group having 1 to 20 carbon atoms, a substituted or unsubstituted, linear, branched, or cyclic alkoxy group having 1 to 20 carbon atoms, a substituted or unsubstituted, linear, branched, or cyclic thioalkoxy group having 1 to 20 carbon atoms, a substituted or unsubstituted aryl group, or a substituted or unsubstituted heteroaryl group;

two or more carbon atoms which are not adjacent to each other in $R^1$ and/or $R^2$ may be linked by O, S, NH, —$NR^O$—, $SiR^OR^{OO}$—, —CO—, —COO—, —OCO—, —OCOO—, —S—CO—, —CO—S—, —CH=CH—, a substituted or unsubstituted aryl group or a substituted or unsubstituted heteroaryl group, wherein $R^O$ and $R^{OO}$ are the same as or different from each other, and are each independently a hydrogen, an aryl group, or an alkyl group having 1 to 12 carbon atoms; and $R^1$ and $R^2$ may be bonded to each other to form a ring.

In the formulae, in the case where $R^1$ or $R^2$ is a substituted alkyl, alkoxy, or thioalkoxy group having 1 to 20 carbon atoms, the hydrogen atom bonded thereto can be substituted with at least one group of fluoride, chloride, bromine, iodide, and nitrile.

In the formulae, in the case where $R^1$ or $R^2$ is a substituted aryl or heteroaryl group, it can be substituted with a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, or a silane group.

Examples of Ar, Ar' and Ar" in the formula 1 will be listed as follows. However, these examples are for the illustrative purpose only, and the invention is not intended to be limited thereto.

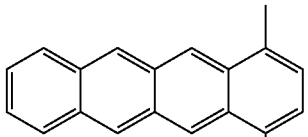

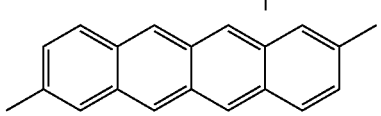

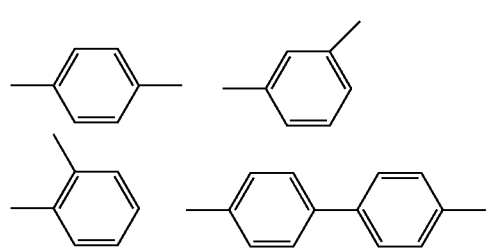

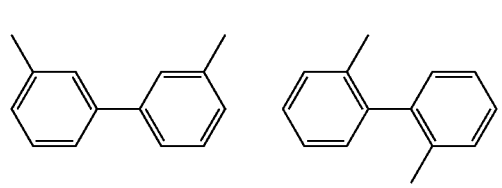

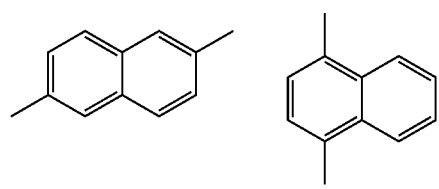

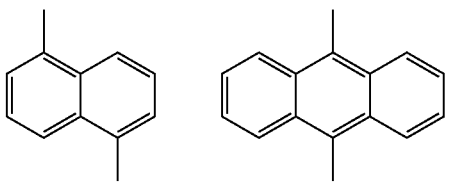

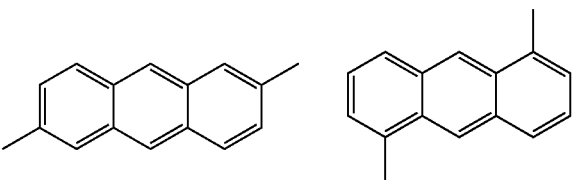

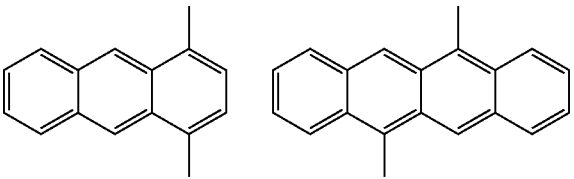

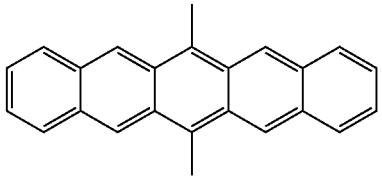

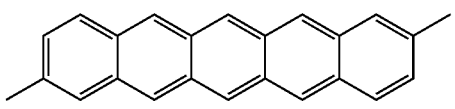

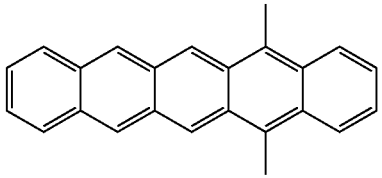

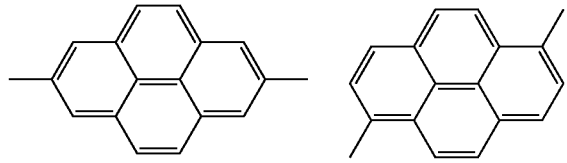

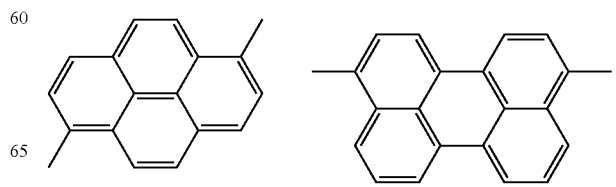

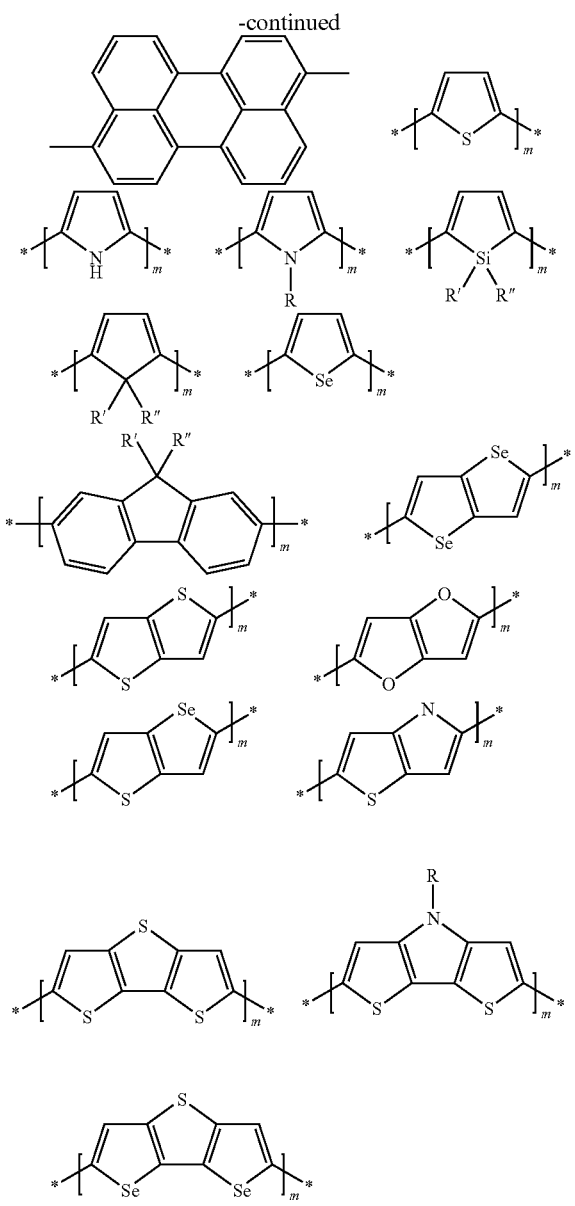

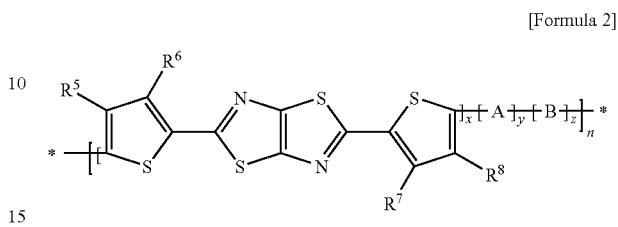

each independently a hydrogen atom, an alkyl group, or an aryl group; and m is an integer of 1 to 10, more preferably an integer of 1 to 6.

The formula 1 may contain a unit of the following formula 2.

[Formula 2]

wherein $R^5$ to $R^8$ are the same as or different from each other, and are each independently a hydrogen atom, a hydroxyl group, a halogen atom, a nitrile group, a nitro group, an ester group, an ether group, an amino group, an imide group, a silane group, a thioester group, a substituted or unsubstituted, linear, branched, or cyclic alkyl group having 1 to 20 carbon atoms, a substituted or unsubstituted, linear, branched, or cyclic alkoxy group having 1 to 20 carbon atoms, a substituted or unsubstituted, linear, branched, or cyclic thioalkoxy group having 1 to 20 carbon atoms, a substituted or unsubstituted aryl group, or a substituted or unsubstituted heteroaryl group;

two or more carbon atoms which are not adjacent to each other in $R^5$ to $R^8$ may be linked by O, S, NH, —$NR^O$—, —CO—, —$SiR^OR^{OO}$—, —CO—, —COO—, —OCO—, —OCOO—, —S—CO—, —CO—S—, —CH=CH—, a substituted or unsubstituted aryl group or a substituted or unsubstituted heteroaryl group, wherein $R^O$ and $R^{OO}$ are the same as or different from each other, and are each independently a hydrogen, an aryl group, or an alkyl group having 1 to 12 carbon atoms;

two or more of $R^5$ to $R^8$ may be bonded to each other to form a ring; and n, x, y, z, A, and B are as defined in the formula 1.

In the formula 2, in the case where at least one of $R^5$ to $R^8$ is a substituted alkyl, alkoxy, or thioalkoxy group having 1 to 20 carbon atoms, the hydrogen atom substituted thereto can be substituted with at least one group of fluoride, chloride, bromine, iodide, and nitrile.

In the formula 2, in the case where at least one of $R^5$ to $R^8$ is a substituted aryl or heteroaryl group, it can be substituted with a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, or a silane group.

In the preferred embodiment of the present invention, specific examples of the formula 1 are represented by the following formulae. However, these examples are for the illustrative purpose only, and the invention is not intended to be limited thereto.

wherein the position, at which no substituent is presented, may be a hydrogen atom, and may be substituted with at least one of a halogen group, an alkyl group, an alkoxy group, a thioalkoxy group, an aryl group, an amino group, a nitrile group, a nitro group, an ester group, an ether group, an amide group, an amide group, an imide group, a hetero group, a vinyl group, an acetylene group, a silane group, or the like; R, R' and R" are the same as or different from each other, and are Formular R-1

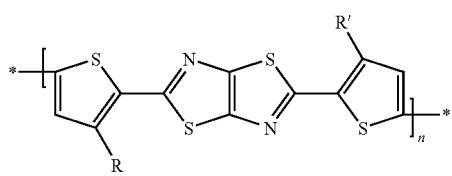

Formular R-2

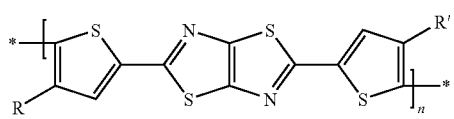

-continued
Formular S-1
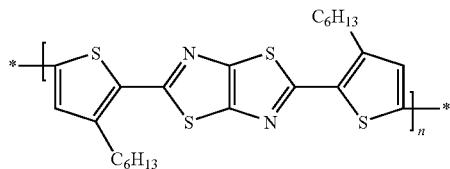
Formular S-2
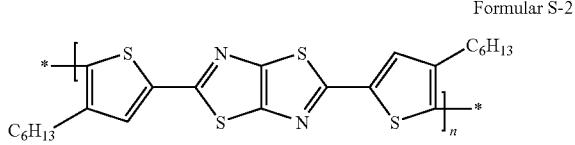
Formular S-3
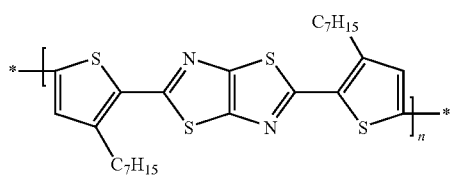
Formular S-4
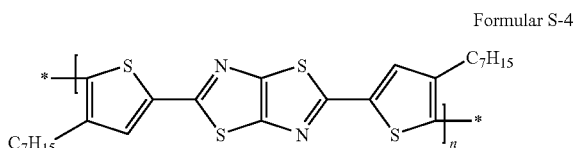
Formular S-5
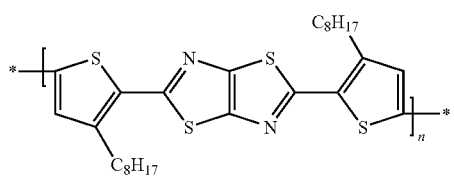
Formular S-6
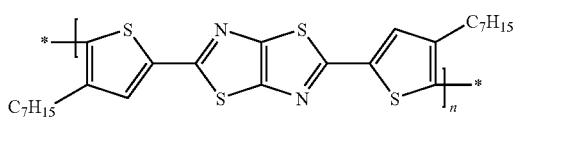
Formular S-7
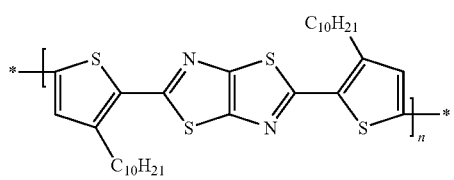
Formular S-8
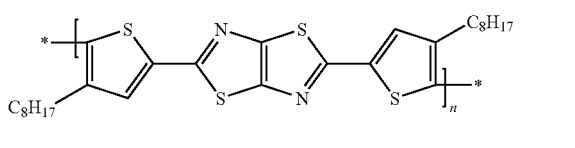
Formular S-9
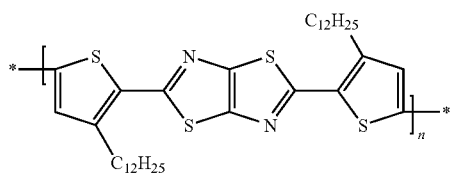
Formular S-10
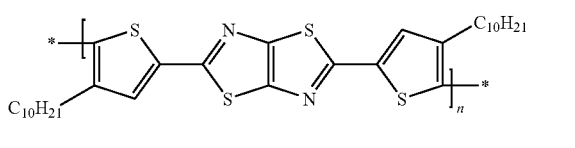
Formular R-3
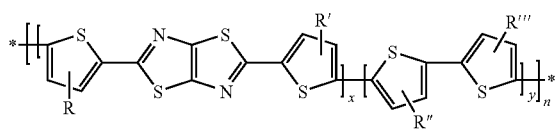
Formular S-11
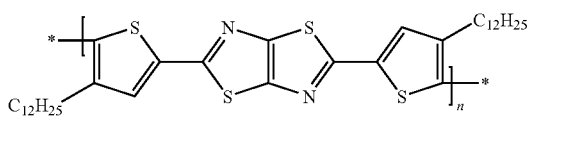
Formular S-12
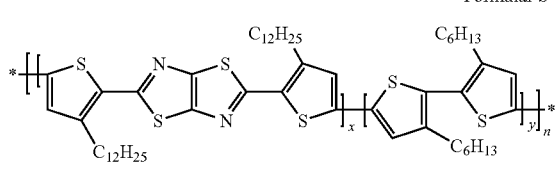
Formular S-13
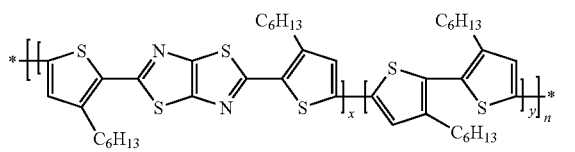
Formular S-14
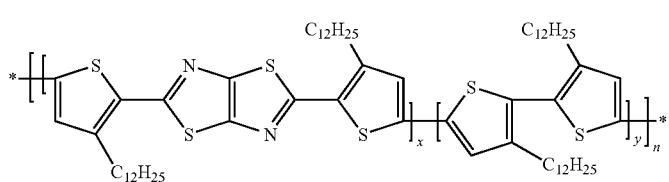

-continued
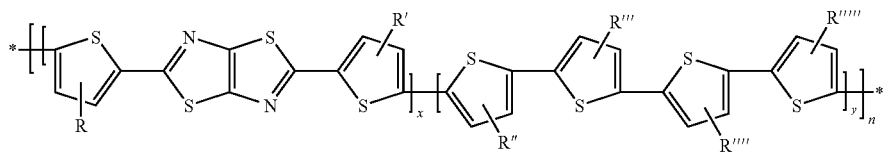
Formular R-4
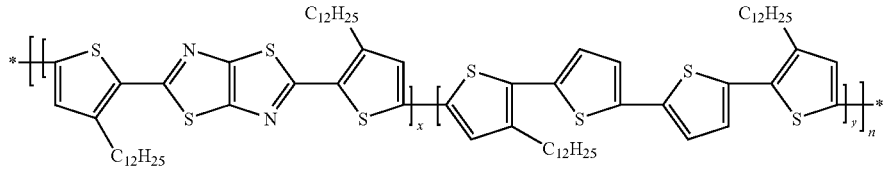
Formular S-15
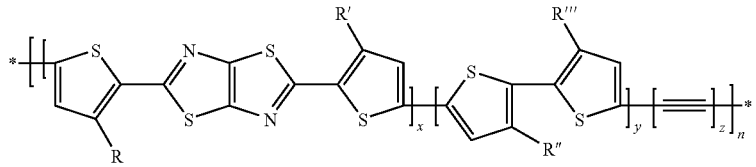
Formular S-16
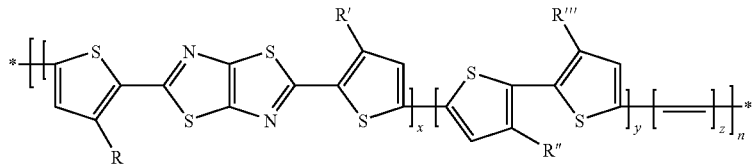
Formular S-17
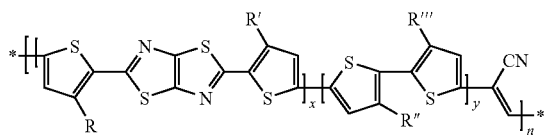
Formular S-18
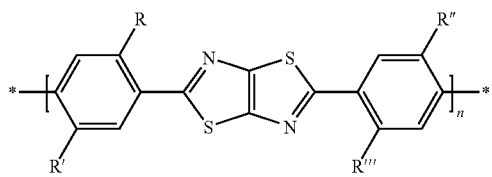
Formular S-19
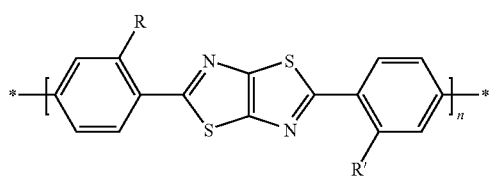
Formular S-20
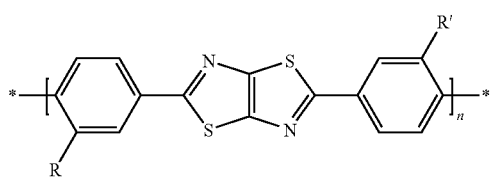
Formular S-21
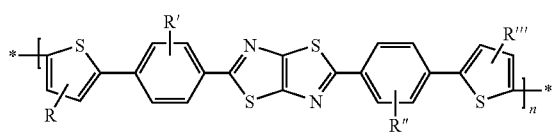
Formular S-22
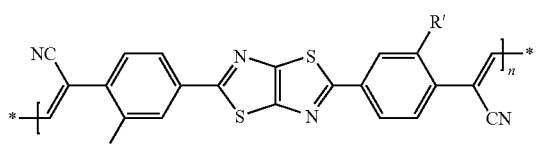
Formular S-23
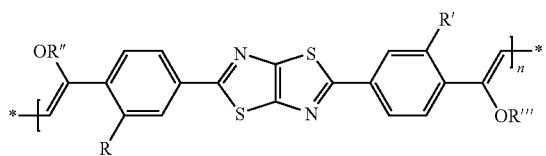
Formular S-24
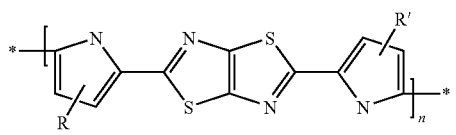
Formular S-25
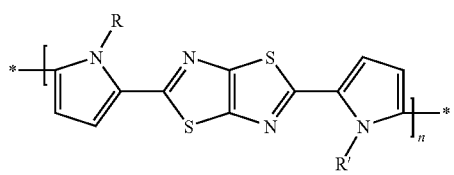
Formular S-26
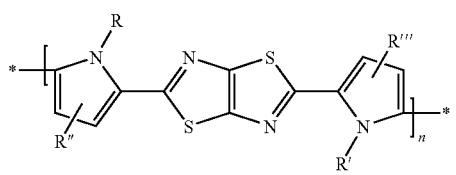
Formular S-27

-continued
Formular S-28
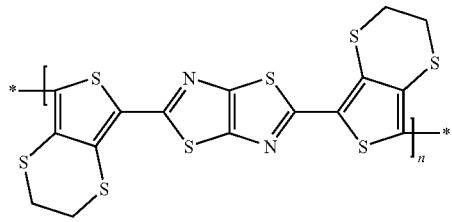
Formular S-29
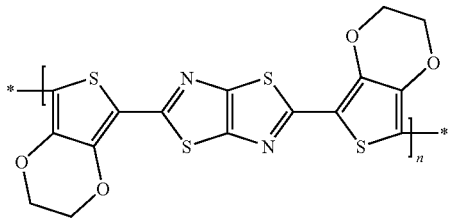
Formular S-30
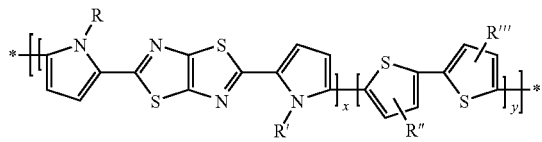
Formular S-31
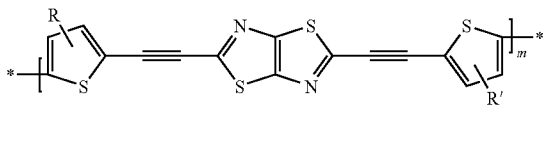
Formular R-5
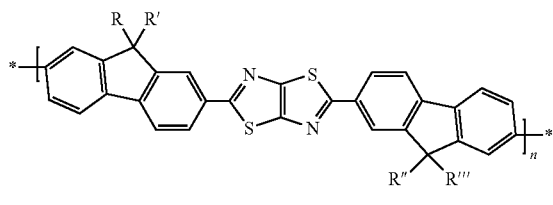
Formular S-32
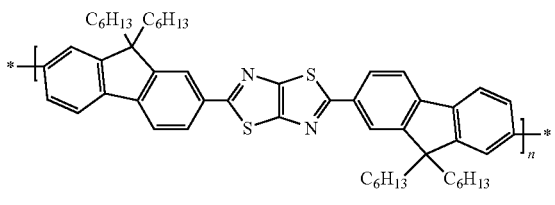
Formular S-33
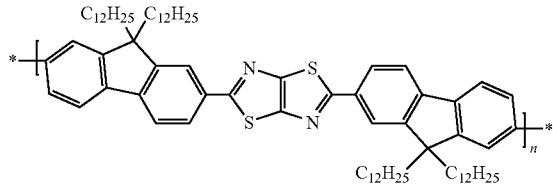
Formular S-34
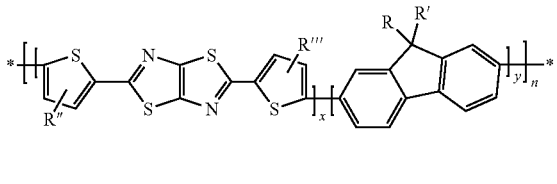
Formular S-35
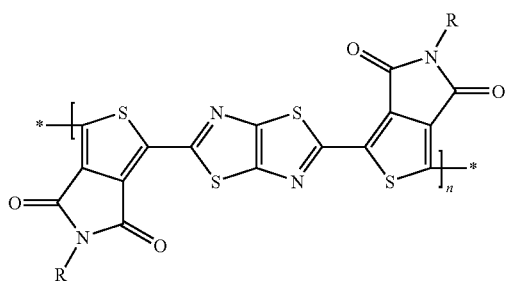
Formular S-36
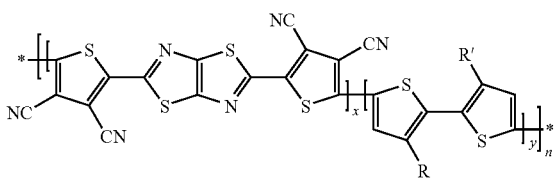
Formular S-37
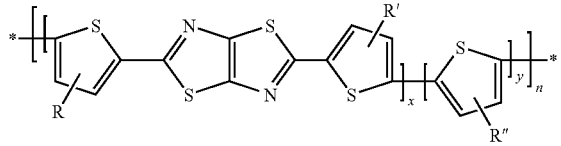
Formular S-38
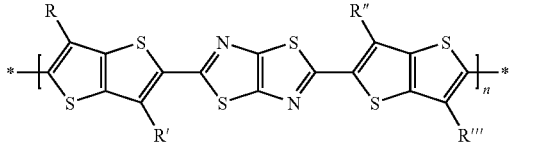
Formular S-39
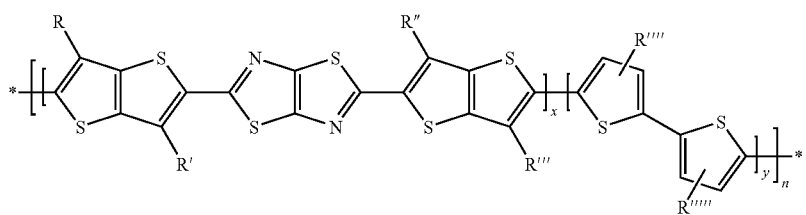

Formular S-40

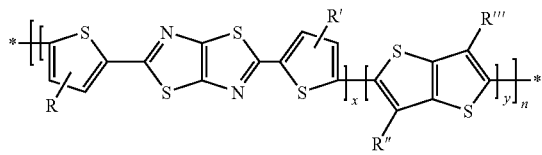

Formular S-41

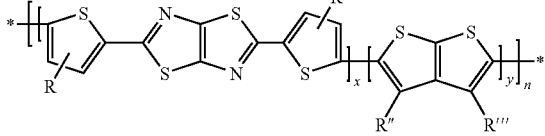

wherein R to R"" contained in the formulae of R-1 to R-5 and S-1 to S-41 are the same as or different from each other, and are each independently a hydrogen atom, a hydroxyl group, a halogen atom, a nitrile group, a nitro group, an ester group, an ether group, an amino group, an imide group, a silane group, a thioester group, a substituted or unsubstituted, linear, branched, or cyclic alkyl group having 1 to 20 carbon atoms, a substituted or unsubstituted, linear, branched, or cyclic alkoxy group having 1 to 20 carbon atoms, a substituted or unsubstituted, linear, branched, or cyclic thioalkoxy group having 1 to 20 carbon atoms, a substituted or unsubstituted aryl group, or a substituted or unsubstituted heteroaryl group;

they may be bonded to each other to form a ring; and n, x, and y are as defined in the formula 1.

Examples of the organic electronic device using an organic semiconductor include an organic light emitting device, an organic transistor, or an organic solar cell. The organic semiconductor is used for these devices, and includes n-type semiconductor and p-type semiconductor like an inorganic semiconductor.

As an example thereof, in the organic light emitting device, the p-type semiconductor is used as a hole injecting layer or a hole transporting layer, and the n-type semiconductor is used as an electron transporting layer or an electron injecting layer. Further, the semiconductor used as the light emitting layer may contain a structure having all the properties of n-type and p-type for the stability of electrons and holes. In addition, the organic light emitting device has preferably a structure minimizing the packing between the molecules, as mentioned above.

On the other hand, in the organic transistor, a p-type semiconductor, in which a charge induced by a gate voltage is a hole, and an n-type semiconductor, in which a charge induced by a gate voltage is an electron, are used, and both of them are used in one device to fabricate a transistor having ambipolarity, thus reducing current consumption. However, among the organic semiconductors for the transistor that have been known up to now, the p-type semiconductor has been known to have better properties and higher stability. In order to solve the problems, a material having the properties of n-type and p-type is introduced to a molecule to increase the stability or the material may be used as the ambipolar material. Further, the organic transistor preferably has a structure having the good packing between molecules in order to increase charge mobility.

In the compound of the formula 1, the thiazolothiazole group is a structure having the property of n-type, and the derivatives, in which suitable substituents are introduced to the group, can be employed in an electron injecting layer or an electron transporting layer of the organic light emitting device. Since the structure also has a planar and hard rod-shape, the substituents inducing the good packing are introduced to Ar, Ar', A, B, or the like of the formula to be used as a semiconductor layer of the organic transistor, which functions as an n-type semiconductor. In the case where as a substituent, the p-type substituent is introduced to induce the ambipolar semiconductor or in the case where the stronger p-type substituent is introduced, the organic semiconductor, which maintains the property of p-type semiconductor and has the improved stability, can be obtained.

Accordingly, the derivatives of the formula 1 of the invention can have suitable properties as an organic semiconductor material used for the organic electronic device such as an organic light emitting device, an organic transistor, and an organic solar cell.

In order to prepare the compound of the formula 1, a halogen substituent of the thiazolothiazole can be prepared by the method as represented by the following Reaction scheme 1.

[Reaction scheme 1]

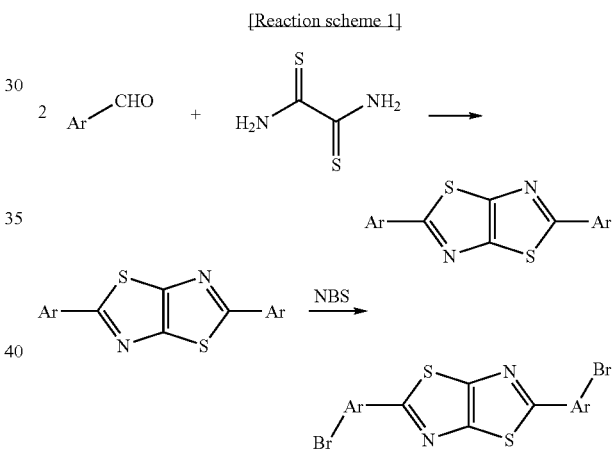

Further, the halogen substituent of the thiazolothiazole for preparing the compound of the formula 1 can be prepared by the method as represented by the following Reaction scheme 2.

[Reaction scheme 2]

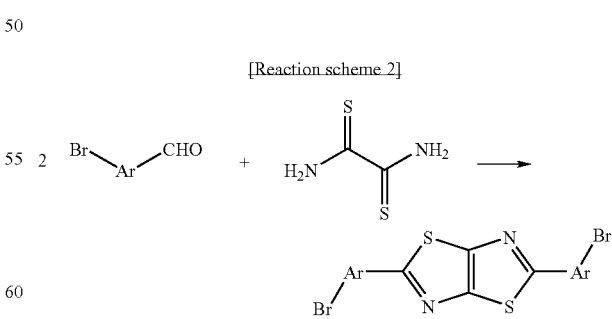

In the Reaction schemes 1 and 2, the bromine is an example of the halogen atom, and fluoride, chloride, iodide or the like can also be used. Ar is as defined in the formula 1.

Subsequently, the halogen substituent of the prepared thiazolothiazole reacts with the materials represented by A and B of the formula 1 by the method such as Stille coupling, Kumada coupling, Suzuki coupling, to prepare a polymer material. Specifically, in the case where Ar is a thiophene based compound, polymerization can be performed by oxidation polymerization using $FeCl_3$ or the like On the other hand, in the present invention, the organic electronic device is an organic electronic device comprising at least two electrodes, and at least one organic material layer disposed between the two electrodes, in which at least one of the organic material layers comprises the compound of the formula 1 or 2. In the organic electronic device, the compound of the formula 1 can be applied to the device by either vacuum deposition or dip coating. In particular, in the case of the derivative having high molecular weight, a thin film having excellent film quality can be obtained by the method of dip coating.

In the case where the organic electronic device according to the invention is the organic light emitting device, the organic electronic device may have a structure in which a first electrode, one or more organic material layers, and a second electrode are sequentially stacked. The organic material layer may be a multilayered structure comprising at least two layers selected from hole injecting layer, hole transporting layer, light emitting layer, electron transporting layer or the like, but are not limited thereto, may be a monolayered structure.

An example of the organic light emitting device according to the present invention is illustrated in FIG. 1. For example, the organic light emitting device according to the present invention can be prepared by depositing a metal, a metal oxide having conductivity or an alloy thereof on a substrate (1) using a PVD (physical vapor deposition) process such as sputtering and e-beam evaporation or solution coating to form an anode (2); forming an organic material layer comprising a hole injecting layer (3), a hole transporting layer (4), a light emitting layer (5), and an electron transporting layer (6) on the anode; and depositing a cathode thereon. Alternatively, the organic light emitting device can be prepared by sequentially depositing a cathode material, an organic material layer, and an anode material on a substrate.

In the case where the organic electronic device according to the invention is an organic transistor, its structure may be a structure of FIG. 2 or 3. That is, the organic transistor according to the invention may have a structure comprising the substrate (8), the insulating layer (9), the gate electrode (10), the source electrode (11), the drain electrode (12), and the organic material layer (13). The organic material layer in the organic transistor of the invention can be formed in the structure of a monolayer or a multilayer.

In the case where the organic electronic device according to the invention is an organic solar cell, its structure may be a structure as shown in FIG. 4. That is, the organic solar cell according to the invention may have a structure in which the substrate (14), the anode (15), the electron donor layer (16), the electron acceptor layer (17), and the cathode (18) are sequentially stacked.

[Mode For Invention]

Hereinafter, the present invention will be described in detail with reference to Examples. Examples are provided only for the purpose of illustrating the present invention, and accordingly it is not intended that the present invention is limited thereto.

Synthesis of Monomer

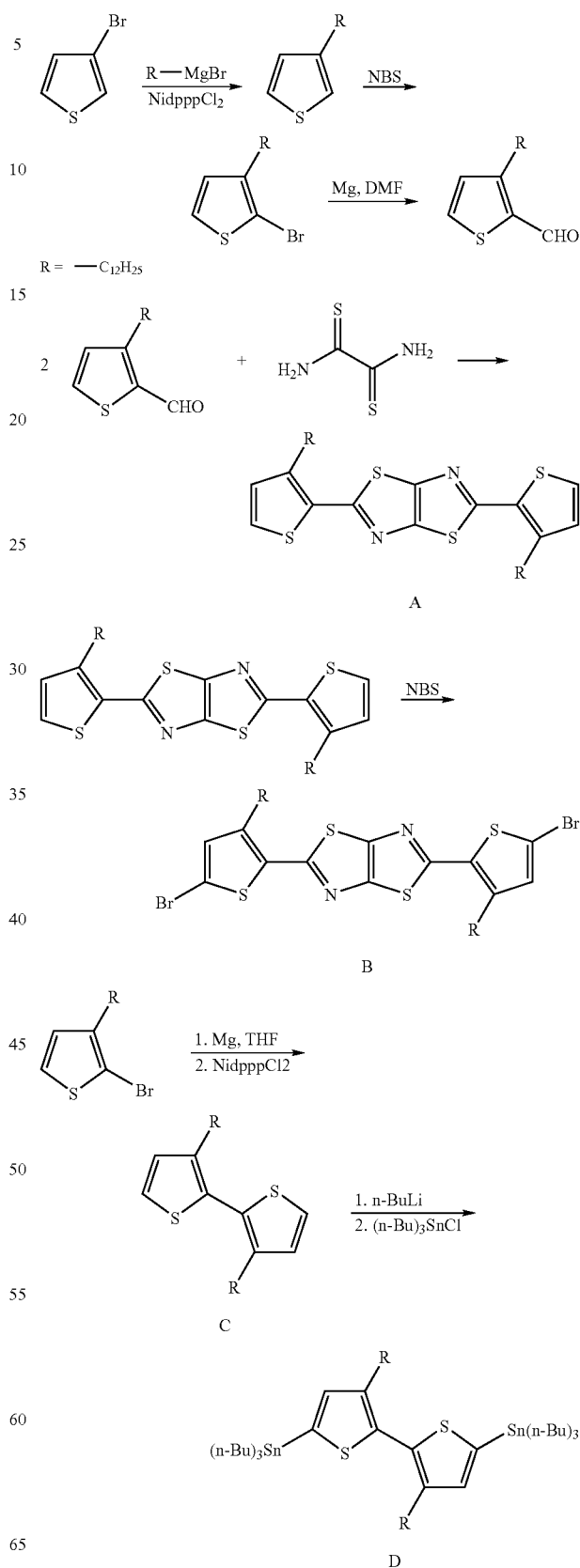

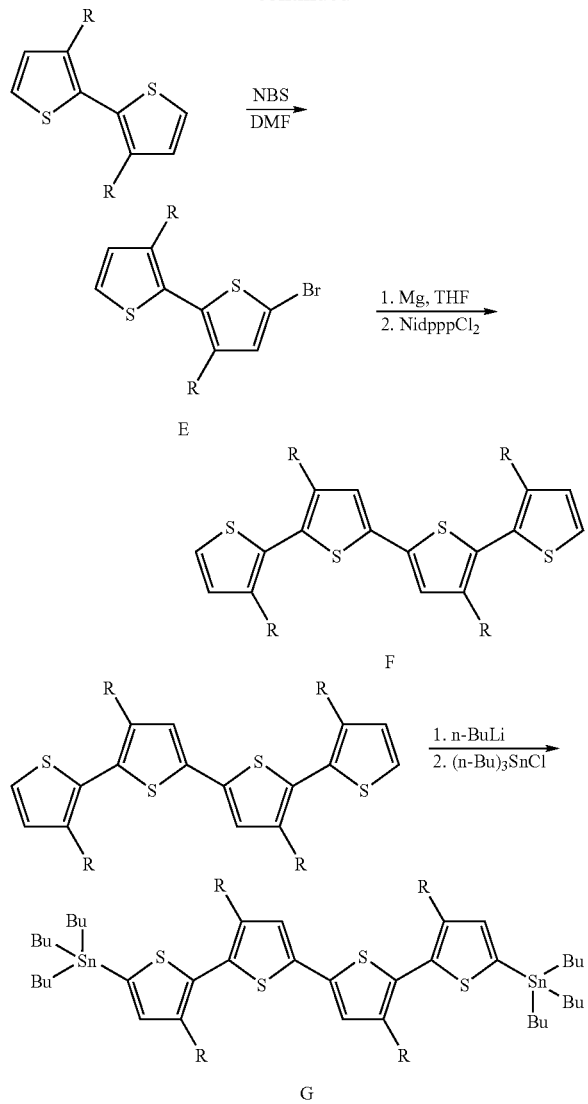

Synthesis of 3-dodecylthiophene

Dried ethyl ether (40 ml) was added to activated magnesium (1.22 g; 50 mmol), and 1-bromododecane (12.46 g; 50 mmol) was added thereto to prepare a Grignard reagent. Then, Ni(dppp)Cl$_2$ (33 mg) was added thereto, and 3-bromothiophene (8 g; 49 mmol) dissolved in 10 ml of ether was slowly added dropwise. The reaction solution was refluxed for one day, and then a mixture of 2N HCl/ice (50 ml) was added to terminate the reaction. The resultant was extracted from ethyl ether, and the solvent was distilled off under reduced pressure. The residue was dissolved in DMF (50 ml) and filtered to remove remaining paraffin. The filtrate was concentrated, and then the residue was distilled off under vacuum to obtain a colorless liquid 3-dodecylthiophene (10.5 g; 85%).

Synthesis of 2-bromo-3-dodecylthiophene

A solution of N-bromosuccinimide (NBS) (48 g; 0.27 mol) dissolved in DMF (160 ml) was added dropwise to 3-dodecylthiophene (68 g; 0.27 mol) dissolved in DMF (110 ml). The reaction solution was stirred for one day, 750 ml of water was added thereto. An organic material was extracted from ethyl ether (3×300 ml), washed with brine and water, and then the residual moisture was removed over anhydrous magnesium sulfate. After removing the solvent, the residue was distilled off under reduced pressure at 125° C./~5 mmHg to obtain a product (84.85 g, yield of 94%).

Synthesis of 3-dodecylthiophene-2-carboaldehyde

Magnesium (0.63 g; 25.8 mmol) and anhydrous THF (25 ml) were put into a flask, and 2-bromo-3-dodecylthiophene (7.78 g; 23.5 mmol) was added dropwise thereto. After starting Grignard reaction, the solution was refluxed until magnesium was almost removed. The purified DMF (3.65 g; ~4 ml; 50 mmol) was slowly added dropwise to the reaction solution. The reaction solution was refluxed for one day, and cooled to 0° C., and 5% HCl (100 ml) was added thereto to terminate the reaction. An organic material layer was extracted from ethyl ether, and the obtained organic material layer was washed sequentially with NaHCO$_3$, a saturated NaCl solution, and water. The residual moisture was removed over anhydrous magnesium sulfate. After removing the solvent, the residue was column separated using silica gel (ethyl acetate/hexane=1/9) to obtain 3-dodecylthiophene-2-carboaldehyde (3.6 g; 55%).

Synthesis of Compound A

3-Dodecylthiophene-2-carboaldehyde (3.9 g; 14 mmol) and dithiooxamide (0.8 g; 6.6 mmol) were put into a flask, heated at 180° C. for one hour, and then cooled to room temperature. Chloroform was added thereto, stirred, and then filtered. The obtained material was recrystallized from hexane three times, and further recrystallized from acetone/ethylacetate to obtain a product (1.5 g; 35%) having a purity of 99.57% (purity by HPLC). The melting point of the material was 60° C.

Synthesis of Compound B

After shielding light, a NBS (0.28 g, 1.57 mmol) solution dissolved in a mixture of chloroform/acetic acid (20/10 ml) was slowly added dropwise to a solution of compound A (0.5 g, 0.78 mmol) dissolved in a CHCl$_3$/AcOH mixture (20/10 ml) at 0° C. The reaction solution was stirred at the same temperature for 2 hours, and then stirred at room temperature for one day. The reaction solution was washed with water, and treated with anhydrous magnesium sulfate. The resultant was recrystallized from acetone/hexane (1:1) to obtain a compound B (0.6 g, 96% of yield).

Synthesis of Compound C

Under nitrogen atmosphere, 2-bromo-3-dodecylthiophene (6.0 g, 18 mmol) was added dropwise to 35 ml of a THF solution, in which magnesium (0.22 g, 9 mmol) was dispersed. After preparing a Grignard reagent, the reaction solution was cooled to room temperature. Pd(dppp)Cl$_2$((1,3-bis[diphenylphospho]propane)dichloronickel(II)) (0.2 g, 0.4 mmol) and 15 ml of anhydrous THF were added dropwise to the reaction solution, and refluxed for 24 hours. After terminating the reaction with a 5% HCl solution, the resultant was diluted with ethyl ether, and washed with water, and moisture was removed over anhydrous magnesium sulfate. After removing the solvent, the residue was column purified with n-hexane on silica gel to obtain a compound C (2.5 g; 54% of yield).

Synthesis of Compound D

A solution of compound C (2.2 g; 4.37 mmol) dissolved in 150 ml of anhydrous THF was treated with 2.5 M n-butyllithium (BuLi) (3.5 ml; 8.74 mmol) at −70° C. The reaction temperature was raised to 0° C., and then cooled to −70° C. Ethyl ether and a saturated NaCl solution were added to the solution, and subjected to phase separation to obtain a product (4.4 g, 93% of yield) from an organic material layer.

Synthesis of Compound E

Under 0° C., a DMF (20 ml) solution, in which NBS (6.23 g; 35 mmol) was dissolved, was added dropwise to a solution of compound C (5,5'-bis(3-dodecyl)-2,2'-dithiophene) (17.6 g; 35 mmol) dissolved in DMF (15 ml). The reaction solution was stirred for one day, and poured into water (100 ml). The organic material layer was extracted from ethyl ether (50 ml) three times, and the obtained organic material layer was washed with a saturated NaCl solution. The resultant was treated with anhydrous magnesium sulfate. After removing the solvent, the residual organic material was distilled off under reduced pressure to obtain a product (14.5 g, 71% of yield).

Synthesis of Compound F

Under nitrogen atmosphere, the compound E (14.5 g, 25 mmol) was added dropwise to 50 ml of a THF solution, in which magnesium (0.3 g, 12.5 mmol) was dispersed. After preparing a Grignard reagent completely, the reaction solution was cooled to room temperature. Pd(dppp)Cl$_2$ (0.2 g, 0.4 mmol) and 20 ml of anhydrous THF were added to the reaction solution, and refluxed for 24 hours. After terminating the reaction with a 5% HCl solution, the resultant was diluted with ethyl ether, and washed with water, and moisture was removed over anhydrous magnesium sulfate. After removing the solvent, the residue was column purified with hexane on silica gel to obtain a product (11.5 g; 46% of yield).

Synthesis of Compound G

A solution of compound F (5 g; 5 mmol) dissolved in 150 ml of THF was treated with n-BuLi 2.5 M (4.4 ml; 11 mmol) at −70° C. The reaction temperature was raised to 0° C., and then cooled to −70° C. Tri(n-butyl)tin chloride (3.57 g; 11 mmol) was added to the solution, and the reaction solution was raised to room temperature to perform phase separation with chloroform and a saturated NaCl solution. The resultant was column separated with chloroform/hexane (1/1) on alumina to obtain a product (6.96 g, 88% of yield).

Example 1

Synthesis of Compound S-9(x=1)

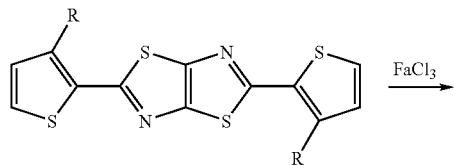

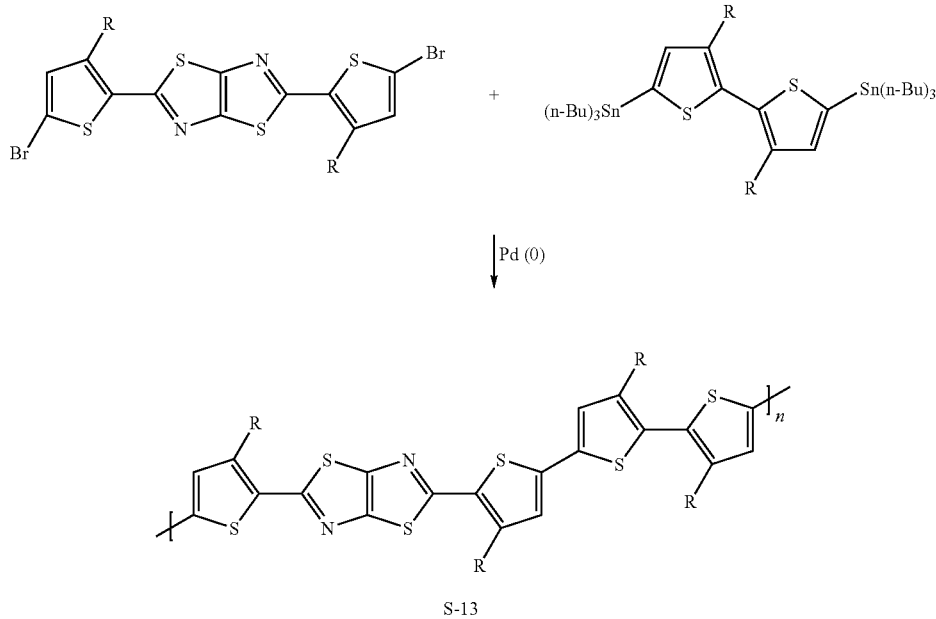

S-9

R=dodecyl

The compound A (1.0 g; 1.6 mmol) was dissolved in chlorobenzene (30 ml), and then FeCl$_3$ (1.5 g; 9.2 mmol) was added dropwise thereto over 30 minutes. The reaction solution was stirred at room temperature for 18 hours, and then added to a methanol/HCl (10:1) solution to terminate a polymerization reaction. The obtained red polymer was washed sequentially with methanol, acetone, hexane, methylene chloride, and chloroform.

The material was melted in hexane. The GPC data of the melted material are shown in FIG. 5.

Molecular weight (Mw)=4058

Example 2

Synthesis of Compound S-13 (x=y=0.5)

R=dodecyl

Pd$_2$(dba)$_3$ (17 mg; 1 mol %) and PPh$_3$ (40 mg; 8 mol %) were added to chlorobenzene (20 ml) at room temperature, and then stirred. The compound D (2 g; 1.85 mmol) and the compound B (1.48 g; 1.85 mmol) were added thereto. The reaction solution was stirred at 80° C. for three days, and cooled to room temperature. Acetone was added thereto to obtain a dark red solid. The solid was filtered, and washed with acetone to obtain a polymer with a yield of 90%.

The NMR and GPC data of the polymer are shown in FIGS. 6 and 7, respectively.

Molecular weight (Mw)=7510

Example 3

Synthesis of compound S-15 (x=y=0.5)

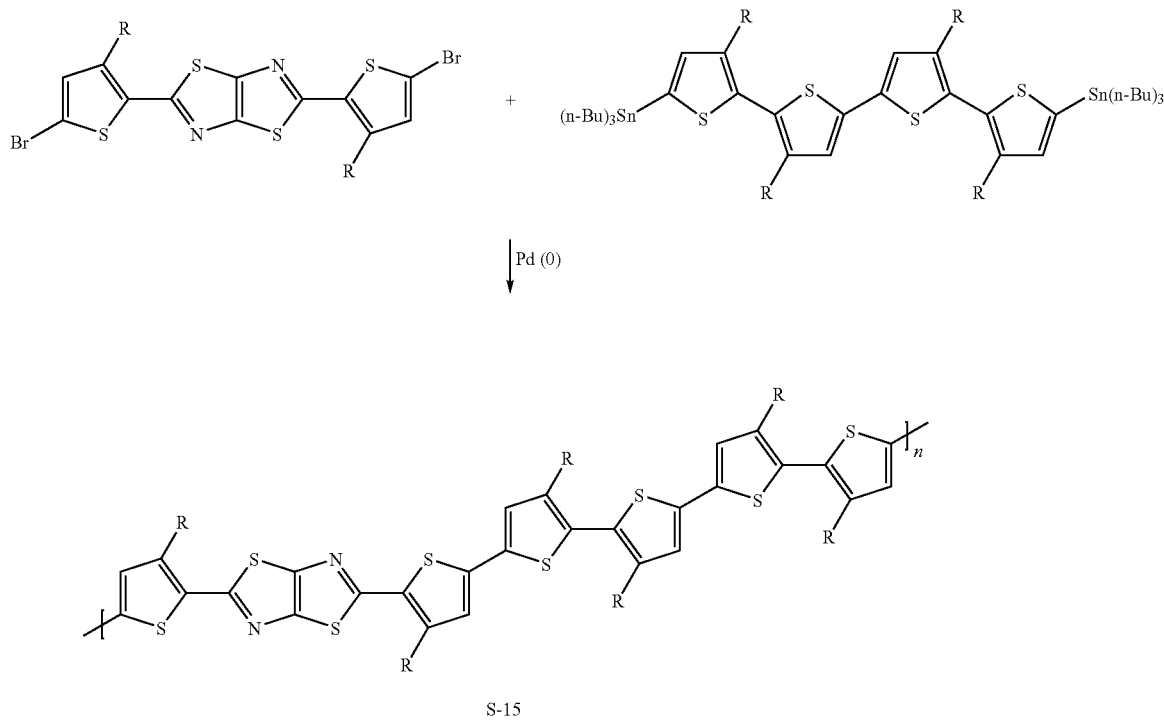

S-15

R=dodecyl

Pd$_2$(dba)$_3$ (17 mg; 1 mol %) and PPh$_2$ (40 mg; 8 mol %) were added to chlorobenzene (20 ml), and then stirred at room temperature. The compound G (2.9 g; 1.85 mmol) and the compound B (1.48 g; 1.85 mmol) were added thereto. The reaction solution was stirred for three days at 80° C., and then cooled to room temperature. Acetone was added thereto to obtain a dark red solid. The solid was filtered, and washed with acetone to obtain 2.3 g of a polymer (80% of yield).

Experimental Example 1

An n-doped silicon wafer was used as a substrate and a gate electrode, and silicon oxide (300 nm) as grown and prepared by heat treatment thereon was used as a gate insulating film. Over the gate insulating film, an e-beam was used to form a source electrode and a drain electrode, made of gold. The substrate prepared above was treated with HMDS (hexamethyldisilazane). Over the substrate, on which the source electrode and the drain electrode had been formed, the compound S-14 dissolved in chlorobenzene (1 w/v %) was spin-coated and heat-treated at 100° C. for 10 minutes to form an organic semiconductor layer. At this time, the width and the length of the channel of the organic transistor were 1 mm and 100 μm, respectively.

The charge transfer degree in the saturated region of the transistor prepared above was calculated to be 2.8×10$^{-3}$ cm$^2$/V.s. The results are shown in FIGS. 8 and 9.

The invention claimed is:

1. A polymer compound represented by the following formula 2:

[Formula 2]

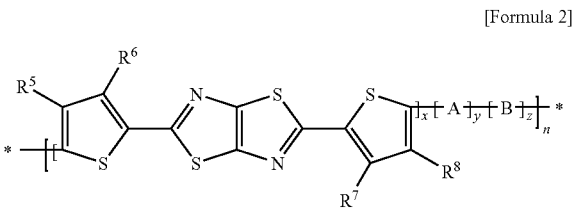

wherein

R$^5$ to R$^8$ are the same as or different from each other, and are each independently a hydrogen atom, a hydroxyl group, a halogen atom, a nitrile group, a nitro group, an ester group, an ether group, an amino group, an imide group, a silane group, a thioester group, a substituted or unsubstituted, linear, branched, or cyclic alkyl group having 1 to 20 carbon atoms, a substituted or unsubstituted, linear, branched, or cyclic alkoxy group having 1 to 20 carbon atoms, a substituted or unsubstituted, linear, branched, or cyclic thioalkoxy group having 1 to 20 carbon atoms, a substituted or unsubstituted aryl group, or a substituted or unsubstituted heteroaryl group;

two or more carbon atoms which are not adjacent to each other in R$^5$ to R$^8$ may be linked by O, S, NH, —NR°—, SiR°R°°—, —CO—, —COO—, —OCO—, —OCOO—, —S—CO—, —CO—S—, —CH═CH—, a substituted or unsubstituted aryl group or a substituted or unsubstituted heteroaryl group, in which R° and R°° are the same as or different from each other, and are each independently a hydrogen, an aryl group, or an alkyl group having 1 to 12 carbon atoms;

two or more of $R^5$ to $R^8$ may be bonded to each other to form a ring, $R^5$ to $R^8$ are not a hydrogen atom at the same time, wherein x is a real number with $0<x\leq1$, y is a real number with $0\leq y<1$, z is a real number with $0\leq z<1$, and $x+y+z=1$;

n is an integer of 10 to 1000; and

A and B are the same as or different from each other, and are each independently an aromatic group, a bivalent heterocyclic group having a conjugated structure, or an acyclic group as follows:

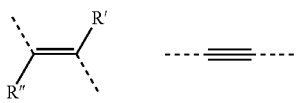

R' and R'' are the same as or different from each other, and may be each independently a hydrogen atom; a linear, branched, or cyclic alkoxy group; a nitrile group; and the dotted line is a portion linked to a backbone of the formula 2.

2. The polymer compound according to claim 1, wherein the A or B is an aromatic group.

3. The polymer compound according to claim 2, wherein the aromatic group is selected from the groups represented by the following formulae:

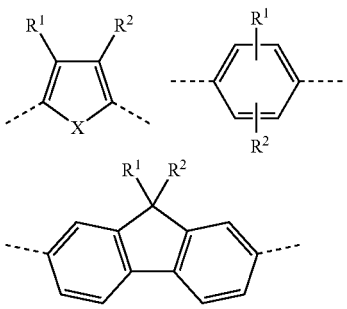

wherein

X is O, S, Se, $NR^3$, $SiR^3R^4$, or $CR^3R^4$, and $R^3$ and $R^4$ are the same as or different from each other, and are each independently a hydrogen atom, a linear, branched, or cyclic alkyl group or aryl group, and may be bonded to each other to form a ring;

$R^1$ and $R^2$ are the same as or different from each other, and are each independently a hydrogen atom, a hydroxyl group, a halogen atom, a nitrile group, a nitro group, an ester group, an ether group, an amino group, an imide group, a silane group, a thioester group, a substituted or unsubstituted, linear, branched, or cyclic alkyl group having 1 to 20 carbon atoms, a substituted or unsubstituted, linear, branched, or cyclic alkoxy group having 1 to 20 carbon atoms, a substituted or unsubstituted, linear, branched, or cyclic thioalkoxy group having 1 to 20 carbon atoms, a substituted or unsubstituted aryl group, or a substituted or unsubstituted heteroaryl group;

two or more carbon atoms which are not adjacent to each other in $R^1$ and/or $R^2$ may be linked by O, S, NH, —NR°—, SiR°R°°—, —CO—, —COO—, —OCO—, —OCOO—, —S—CO—, —CO—S—, —CH═CH—, a substituted or unsubstituted aryl group or a substituted or unsubstituted heteroaryl group, in which R° and R°° are the same as or different from each other, and are each independently a hydrogen, an aryl group, or an alkyl group having 1 to 12 carbon atoms; and $R^1$ and $R^2$ may be bonded to each other to form a ring.

4. The polymer compound according to claim 3, wherein in the case where $R^1$ or $R^2$ is a substituted alkyl, alkoxy, or thioalkoxy group having 1 to 20 carbon atoms, it is substituted with at least one substituent selected from the group consisting of fluoride, chloride, bromine, iodide, and nitrile.

5. The polymer compound according to claim 3, wherein in the case where the $R^1$ or $R^2$ is a substituted aryl or heteroaryl group, it is substituted with at least one substituent selected from the group consisting of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, and a silane group.

6. The polymer compound according to claim 2, wherein the aromatic group are selected from the following formulae:

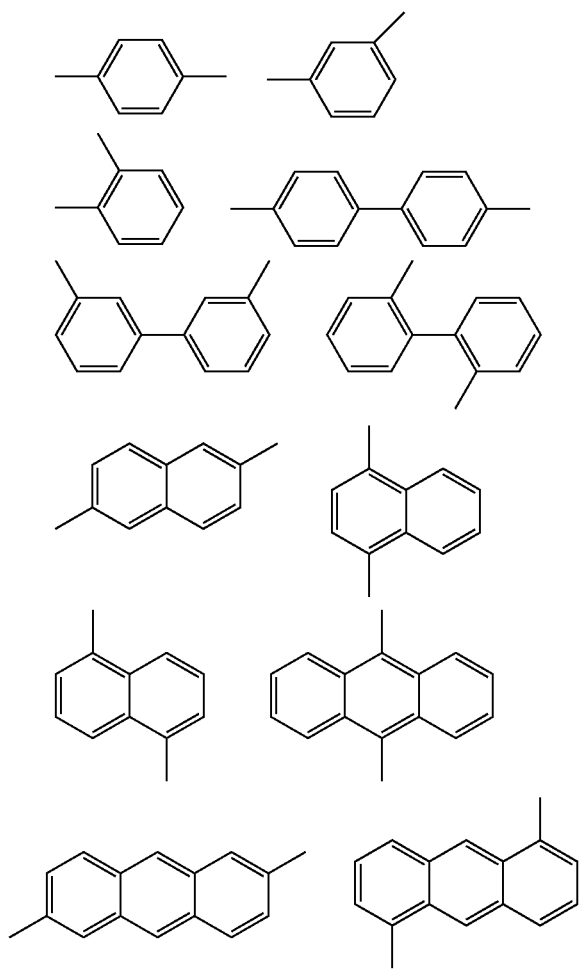

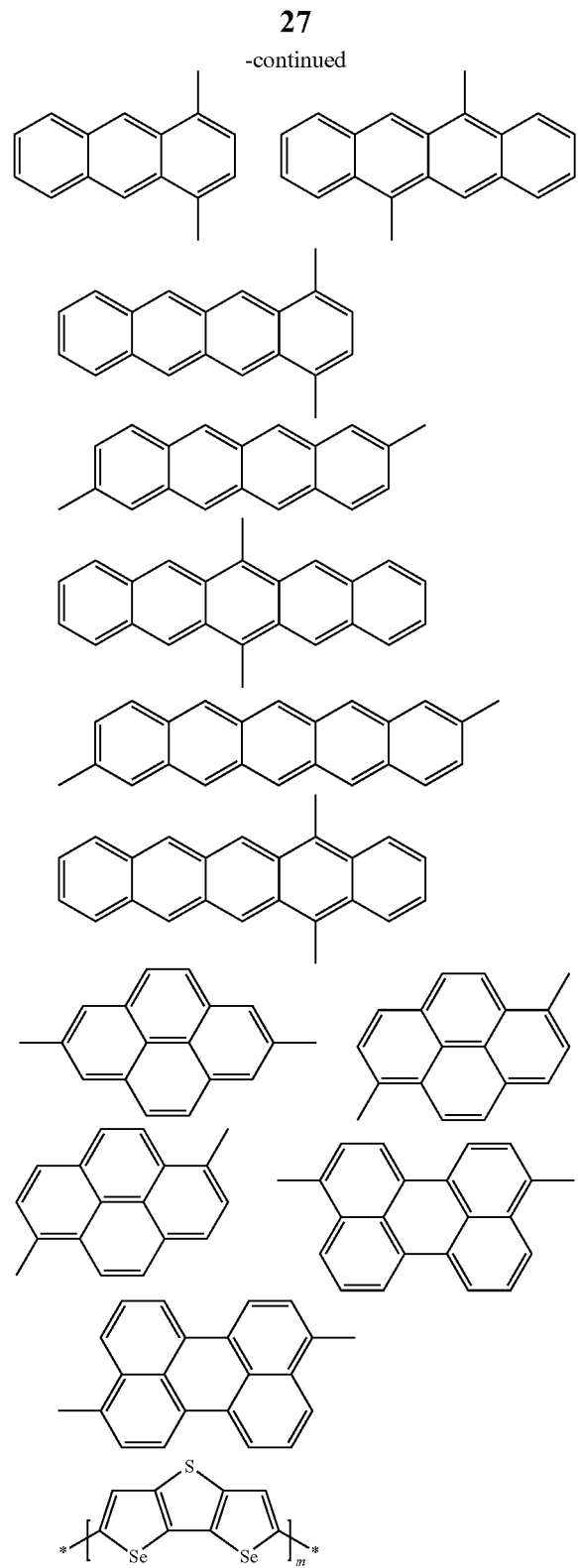

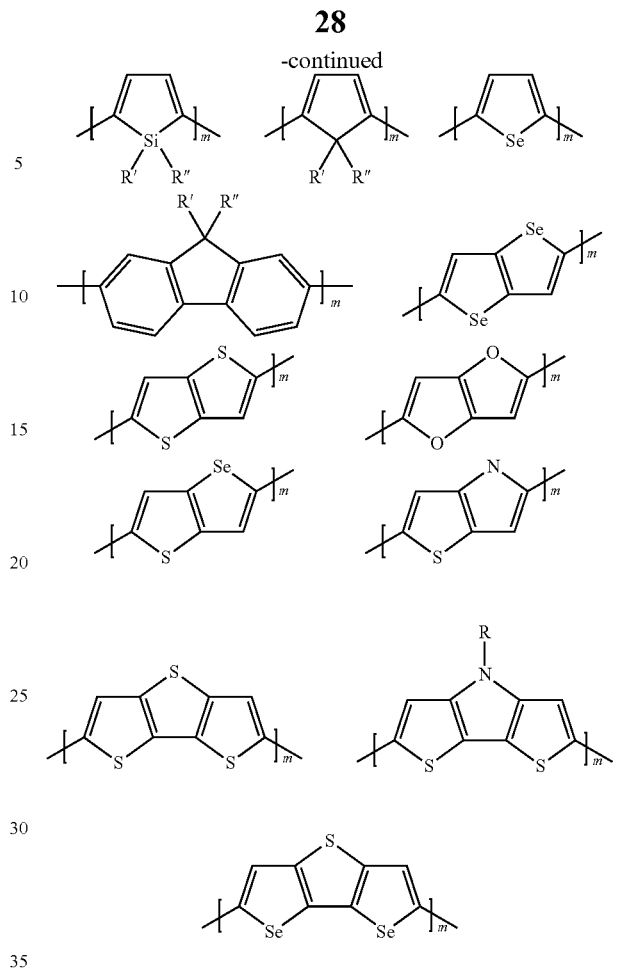

wherein at least one hydrogen atom in the above formulae could be substituted by a substituent selected from a halogen group, an alkyl group, an alkoxy group, a thio-alkoxy group, an aryl group, an amino group, a nitrile group, a nitro group, an ester group, an ether group, an amide group, an amide group, an imide group, a hetero group, a vinyl group, an acetylene group, and a silane group; R, R' and R" are the same as or different from each other, and are each independently a hydrogen atom, an alkyl group, or an aryl group; and m is an integer of 1 to 10.

7. The polymer compound according to claim 1, wherein in the case where at least one of $R^5$ to $R^8$ is a substituted alkyl, alkoxy, or thioalkoxy group having 1 to 20 carbon atoms, the hydrogen atom substituted thereto is substituted with at least one substituent selected from the group consisting of fluoride, chloride, bromine, iodide, and nitrile.

8. The polymer compound according to claim 1, wherein in the case where at least one of $R^5$ to $R^8$ is a substituted aryl or heteroaryl group, it is substituted with at least one substituent selected from the group consisting of a halogen group, a nitrile group, a hydroxyl group, an alkyl group, an alkoxy group, a vinyl group, an acetylene group, a thioalkoxy group, a nitro group, an amide group, an imide group, an ester group, an ether group, an amino group, or a silane group.

9. The polymer compound according to claim 1, wherein the compound of the formula 2 is selected from the following formulae R-1 to R-4, S-16 to S-18, S-34, S-36 to S-37, and S-40 to S-41:

Formular R-1
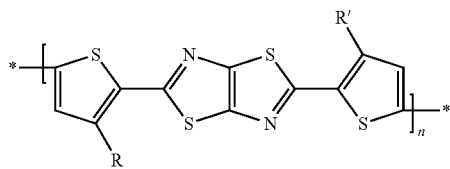
Formular R-2
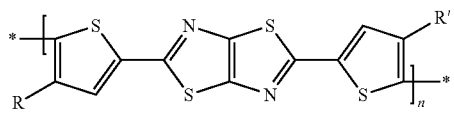
Formular R-3
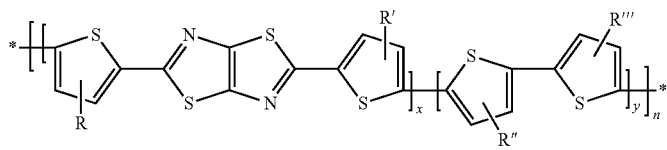
Formular R-4
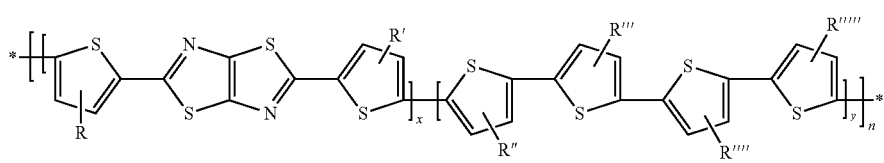
Formular S-16
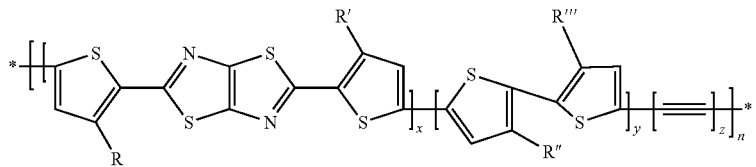
Formular S-17
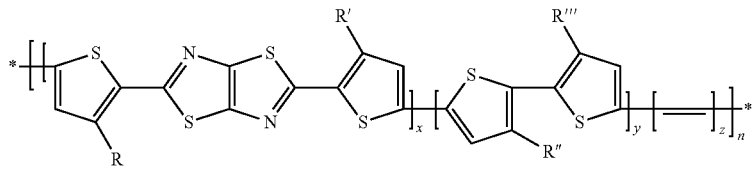
Formular S-18
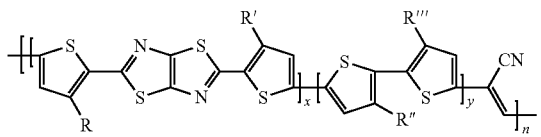
Formular S-34
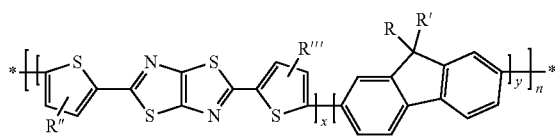
Formular S-36
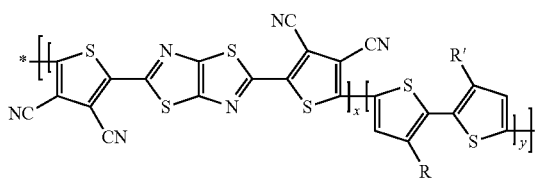
Formular S-37
Formular S-40
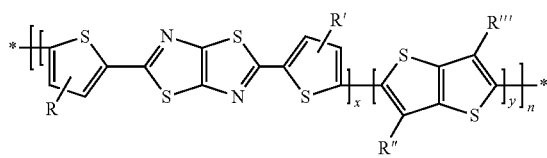
Formular S-41
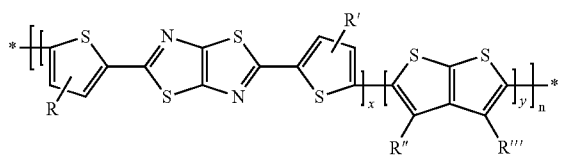

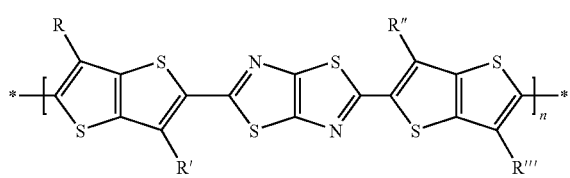

wherein R to R'''' are the same as or different from each other, and are each independently an oxygen atom, a halogen atom, a nitrile group, a nitro group, an ester group, an ether group, an amino group, an imide group, a silane group, a thioester group, a substituted or unsubstituted, linear, branched, or cyclic alkyl group having 1 to 20 carbon atoms, a substituted or unsubstituted, linear, branched, or cyclic alkoxy group having 1 to 20 carbon atoms, a substituted or unsubstituted, linear, branched, or cyclic thioalkoxy group having 1 to 20 carbon atoms, a substituted or unsubstituted aryl group, or a substituted or unsubstituted heteroaryl group.

10. The polymer compound according to claim 9, wherein the formula R-1 is selected from the following formulae:

Formular S-1
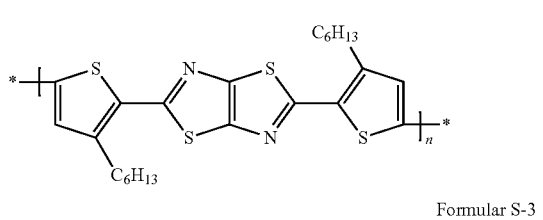

Formular S-3
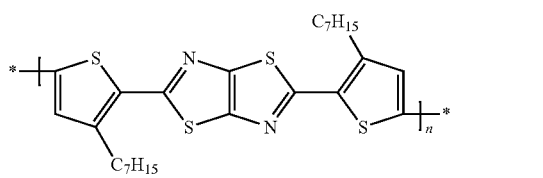

Formular S-5
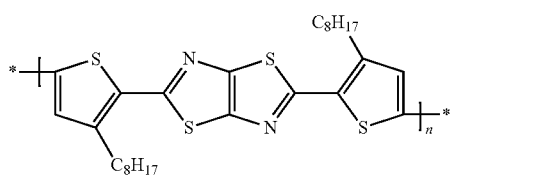

Formular S-7
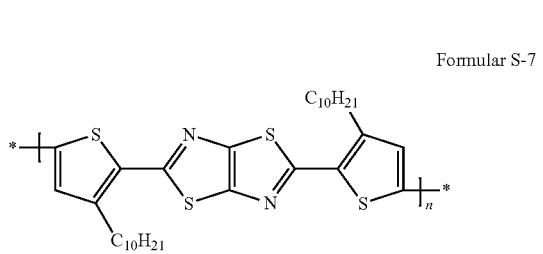

-continued

Formular S-38

Formular S-9
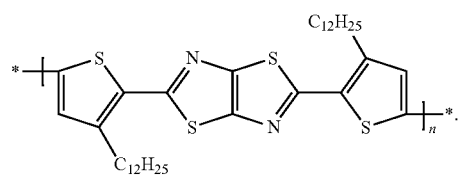

11. The compound according to claim 9, wherein the formula R-2 is selected from the following formulae:

Formular S-2
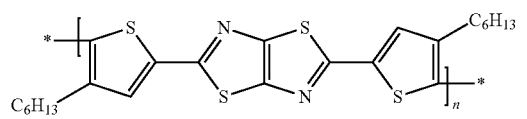

Formular S-4
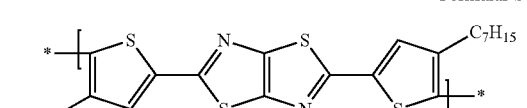

Formular S-6
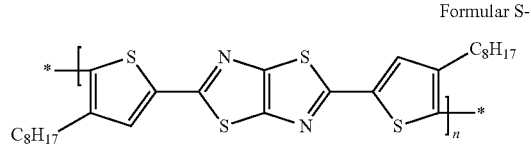

Formular S-8
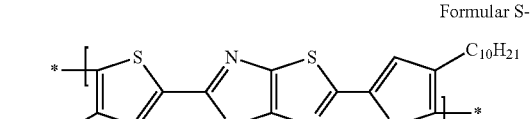

Formular S-10
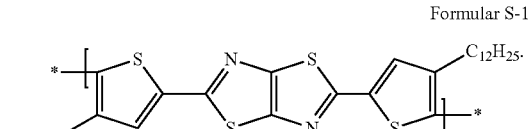

12. The compound according to claim 9, wherein the formula R-3 is selected from the following formulae:

Formular S-11
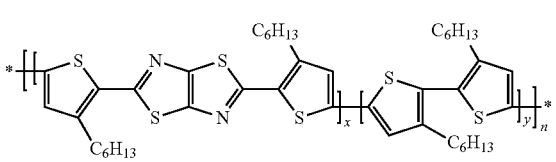

Formular S-12

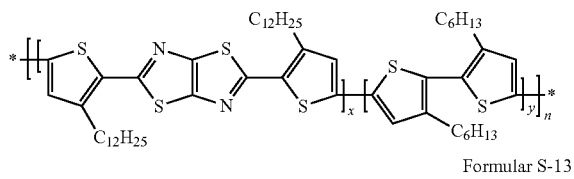

Formular S-13

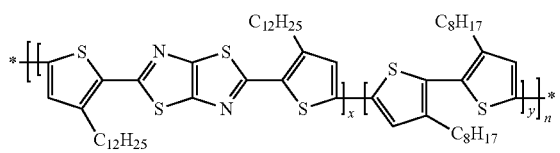

Formular S-14

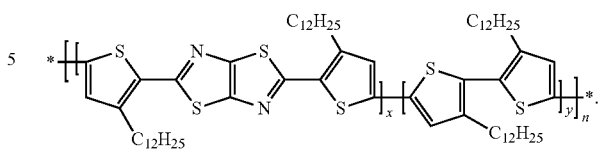

13. The polymer compound according to claim 9, wherein the formula R-4 is the following formula S-15:

Formular S-15

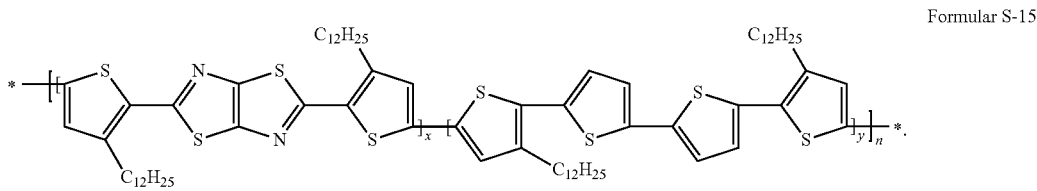

14. An organic electronic device comprising at least two electrodes, and one or more organic material layers disposed between the two electrodes, wherein one or more layers of the organic material layers comprise the polymer compound of claim 1.

15. The organic electronic device according to claim 14, wherein the organic electronic device is an organic light emitting device having a structure in which a first electrode, one or more organic material layers, and a second electrode are sequentially stacked, and one or more layers of the organic material layers comprise the polymer compound of claim 1.

16. The organic electronic device according to claim 14, wherein the organic electronic device is an organic transistor having a structure comprising a gate electrode, an insulating layer, one or more organic material layers, a source electrode, and a drain electrode, and one or more layers of the organic material layers comprise the polymer compound of claim 1.

17. The organic electronic device according to claim 14, wherein the organic electronic device is an organic solar cell having a structure in which an anode, an electron donor layer, an electron acceptor layer, and a cathode are sequentially stacked, and the electron donor layer and/or the electron acceptor layer comprise(s) the polymer compound of claim 1.

* * * * *